(12) United States Patent
Hieda

(10) Patent No.: US 6,611,017 B2
(45) Date of Patent: Aug. 26, 2003

(54) SEMICONDUCTOR DEVICE PROVIDED WITH CAPACITOR HAVING CAVITY-PROVIDED ELECTRODE

(75) Inventor: Katsuhiko Hieda, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 52 days.

(21) Appl. No.: 09/816,163

(22) Filed: Mar. 26, 2001

(65) Prior Publication Data

US 2001/0025977 A1 Oct. 4, 2001

(30) Foreign Application Priority Data

Mar. 27, 2000 (JP) .......................... 2000-087546

(51) Int. Cl.[7] .............................. H01L 27/108
(52) U.S. Cl. ....................... 257/306; 257/296
(58) Field of Search ................. 257/295, 296–298, 257/415, 303, 306, 307, 308, 304, 301, 300, 302, 310–311

(56) References Cited

U.S. PATENT DOCUMENTS 5,998,825 A * 12/1999 Ochiai
6,159,788 A * 12/2000 Jenq et al.
6,242,321 B1 * 6/2001 Acosta et al.
6,316,799 B1 * 11/2001 Kunikiyo

FOREIGN PATENT DOCUMENTS

JP 2000-114474 4/2000
JP 2000124423 * 4/2000

OTHER PUBLICATIONS

Hieda, K. et al., "Semiconductor Device And Manufacturing Method Thereof", Ser. No. 09/369,174, filed on Aug. 5, 1999.

* cited by examiner

Primary Examiner—Nathan J. Flynn
Assistant Examiner—Kevin Quinto
(74) Attorney, Agent, or Firm—Finnegan, Henderson, Farabow, Garrett & Dunner, L.L.P.

(57) ABSTRACT

A plurality of storage node electrodes are formed on a semiconductor substrate. A capacitor insulating film is formed on the storage node electrodes. A plate electrode, facing the storage node electrodes, is formed on the capacitor insulating film. A cavity is formed in the plate electrode.

23 Claims, 13 Drawing Sheets

SEMICONDUCTOR DEVICE PROVIDED WITH CAPACITOR HAVING CAVITY-PROVIDED ELECTRODE

CROSS-REFERENCE TO RELATED APPLICATIONS

This application is based upon and claims the benefit of priority from the prior Japanese Patent Application No. 2000-087546, filed Mar. 27, 2000, the entire contents of which are incorporated herein by reference.

BACKGROUND OF THE INVENTION

The present invention relates to a semiconductor device having a three-dimensional capacitor such as a stack-type capacitor.

In recent years, as the packing density of elements on a semiconductor integrated circuit increases, the minimum dimensions which can be processed and the area of a memory cell are decreased more and more. Accordingly, the area of a capacitor in a memory cell has become very small.

As the memory cell becomes smaller, the capacitance (storage capacitance: Cs) also becomes smaller. However, to keep the sensitivity high and to prevent soft errors, the capacitance should not be so small.

In order to overcome this problem, two methods have been considered. One is to form a capacitor three-dimensionally, so that the surface area of the capacitor can be increased with cells of a small area, thereby increasing the capacitance of the capacitor. The other is to use a material of a high dielectric constant (so-called "high-k material") as a material of the capacitor insulating film.

In the generation of a design rule of about 0.12 $\mu$m (corresponding to the 1 G-bit DRAM generation), it has become difficult to form a storage node electrode (hereinafter referred to as an SN electrode) having a complex three-dimensional shape in the process of manufacturing a semiconductor device. Therefore, the aforementioned method of using a capacitor insulating film of a high-k material is very important to increase the capacitance.

Representative high-k materials are $Ta_2O_5$ (hereinafter abbreviated as TAO) and $(Ba, Sr)TiO_3$ (hereinafter abbreviated as BST). Even if a capacitor insulating film of this kind of material is used, a three-dimensional capacitor should indispensably be introduced. A stack-type capacitor is known as one of the three-dimensional capacitors.

FIG. 1 shows a cross section of a DRAM employing a stack-type capacitor (stack-type DRAM). In FIG. 1, a reference numeral 101 denotes a silicon substrate, 102 an element isolating region, 103 a gate insulating film, 104 a gate electrode (word line), 105 a source/drain region, 106 an interlayer insulating film, 107 a bit line, 108 a plug (SN contact), 109 a barrier metal film (for example, a $Ti/TiSi_2$ film), 110 a three-dimensional SN electrode, 111 a capacitor insulating film made of a high-k material (for example, a BST film), and 112 a plate electrode (hereinafter referred to as a PL electrode) serving as a common electrode.

After the three-dimensional capacitor having the SN electrode 110 and the capacitor insulating film 111 made of the high-k material is formed, a high-heat stress is generated in a region among the SN electrode 110, the capacitor insulating film 111 and the PL electrode 112 by a later process involving heat (a heat process). As a result, the adhesion between these elements 110 to 112 is reduced. In addition, a leak current of the capacitor is increased by the heat stress on the capacitor insulating film 111 or the storage capacitance of the capacitor is reduced. These problems are considered to be prominent particularly in the case where the SN electrode 110 is cylindrical or box-shaped, since in this case the side wall of the SN electrode 110 is thin.

As described above, the capacitor that comprises the conventional three-dimensional SN electrode structure, the capacitor insulating film made of a high-k material and the PL electrode serving as the common electrode has the following problems. Much heat-stress is generated in a region among the SN electrode, the capacitor insulating film and the PL electrode due to a heat process after formation of the capacitor. The heat stress results in reduction in the adhesion between these elements, increase in leak current or reduction in storage capacitance.

BRIEF SUMMARY OF THE INVENTION

The present invention has been made in view of the above problems. An object is to provide a semiconductor device having a plurality of capacitors, in which a heat stress applied thereto in a later process can be reduced.

Representatives of the invention disclosed in the present application will be outlined below. To achieve the above object, according to a first aspect of the present invention, there is provided a semiconductor device comprising: a semiconductor substrate; and a plurality of capacitors formed on the semiconductor substrate and having a plurality of first electrodes, a capacitor insulating film and a second electrode, the capacitor insulating film being interposed between the plurality of first electrodes and the second electrode, wherein a cavity is present in at least one of the plurality of first electrodes or in the second electrode.

To achieve the above object, according to a second aspect of the present invention, there is provided a semiconductor device comprising: a semiconductor substrate; a plurality of storage node electrodes formed on the semiconductor substrate; a capacitor insulating film formed on the plurality of storage node electrodes; and a plate electrode formed on the capacitor insulating film and opposing to the plurality of storage node electrodes on the capacitor insulating film, and at least one cavity formed in the plate electrode.

To achieve the above object, according to a third aspect of the present invention, there is provided a semiconductor device comprising: a semiconductor substrate; a plurality of storage node electrodes formed on the semiconductor substrate and spaced apart from one another; a capacitor insulating film formed on upper surfaces and side surfaces of the plurality of storage node electrodes; and a plate electrode formed on the upper surfaces of the plurality of storage node electrodes and between adjacent storage node electrodes, a portion of the plate electrode between the adjacent storage node electrodes including a cavity, the capacitor insulating film being interposed between the plurality of storage node electrodes and the plate electrode.

With the semiconductor device having the above structure, the heat stress, which an electrode receives in a heat process, is reduced by the cavity in the electrode. Accordingly, the capacitor insulating film and the electrode receive less heat stress in the heat process. In other words, the heat stress received by the capacitor as a whole in the heat process after the capacitor forming process is effectively reduced.

Additional objects and advantages of the invention will be set forth in the description which follows, and in part will be obvious from the description, or may be learned by practice of the invention. The objects and advantages of the invention

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

First Embodiment

Figure 1:
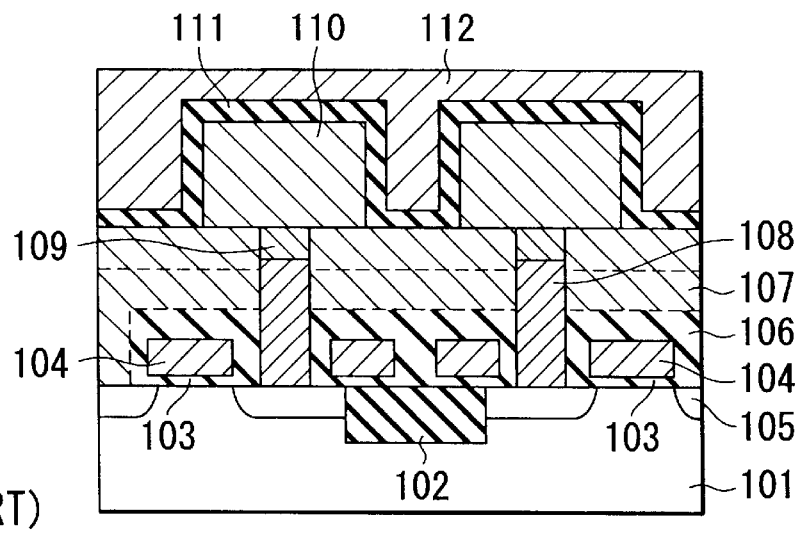
FIG. 1 is a cross-sectional view of a memory cell of a conventional stack-type DRAM.
Figure 2A:
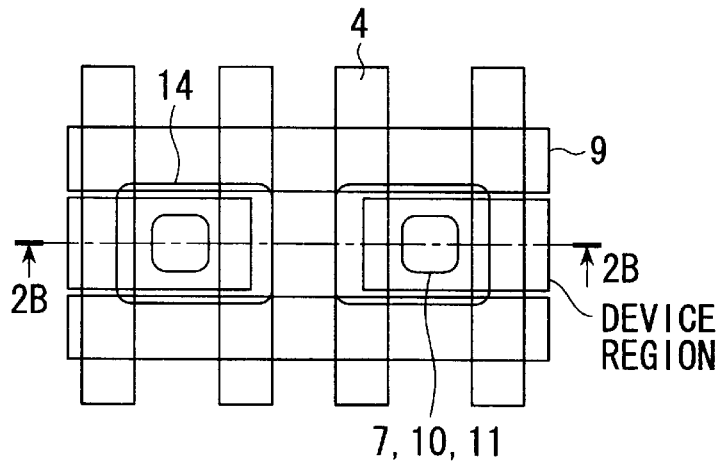
FIG. 2A is a plan view of a memory cell of a stack-type DRAM according to a first embodiment of the present invention.
Figure 2B:
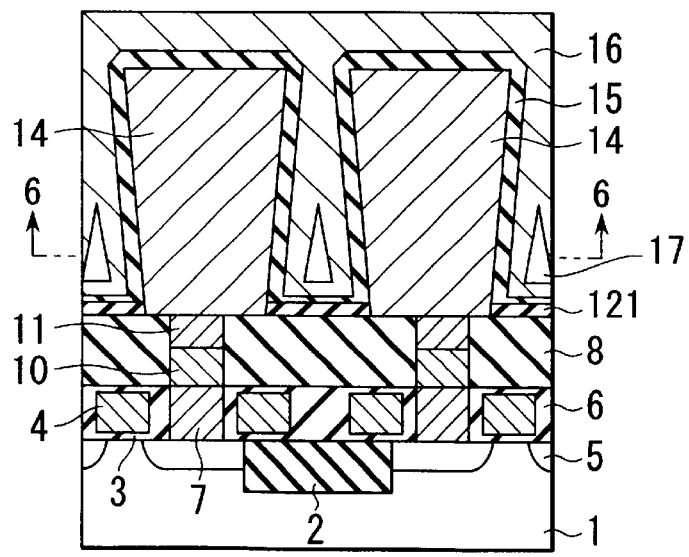
FIG. 2B is a cross-sectional view of the memory cell of the stack-type DRAM according to the first embodiment.

FIG. 2A is a plan view of a memory cell of a stack-type DRAM according to a first embodiment of the present invention. FIG. 2B is a cross-sectional view of the memory cell taken along the line 2B—2B in FIG. 2A. These drawings show a schematic structure of memory cells adjacent to each other in a direction parallel to a bit line. A bit line contact region is omitted from the drawings.

The stack-type DRAM of this embodiment is greatly different from the conventional stack-type DRAM in the following respects.

A PL electrode 16 of the present invention has a cavity 17 in a region between two adjacent SN electrodes 14 in order to reduce film stress due to heat stress.

This structure of the PL electrode 16 has the following advantages.

(1) The heat stress, which the PL electrode 16 receives in a heat process, is reduced by the cavity 17 in the PL electrode 16. Accordingly, the capacitor insulating film made of a high-k material and the SN electrodes 14 receive less heat stress in the heat process. In other words, the heat stress received by the capacitor as a whole in a heat process after the capacitor forming process is effectively reduced.

Consequently, the adhesion between the capacitor and a base film is improved, thereby reducing defects due to pealing of the SN electrode 14 and the PL electrode 16, etc.

(2) Since the heat stress received by the capacitor as a whole is effectively reduced, the entire stress generated in the capacitor insulating film 15 is reduced, thereby suppressing increase in leak current of the capacitor. As a result, the manufacturing yield of the capacitor can be stably improved.

(3) Since the heat stress received by the capacitor as a whole is effectively reduced, the interlayer insulating film formed on the capacitor is prevented from peeling. As a result, the manufacturing yield of the capacitor can be stably improved.

Figure 3A:
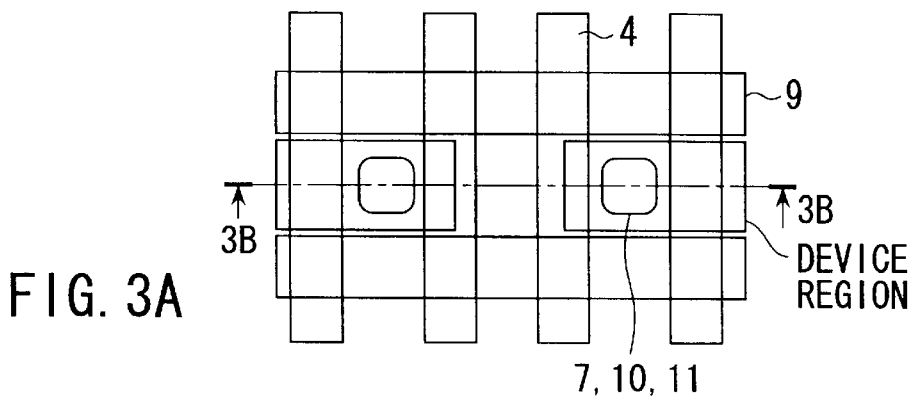
FIG. 3A is a plan view showing a first step for manufacturing the memory cell of the stack-type DRAM according to the first embodiment.
Figure 3B:
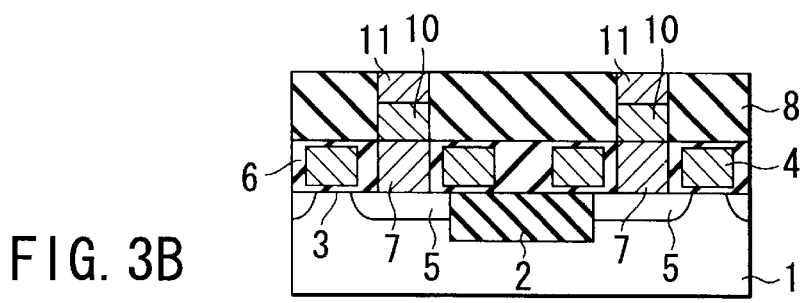
FIG. 3B is a cross-sectional view showing the first step for manufacturing the memory cell of the stack-type DRAM according to the first embodiment.
Figure 4A:
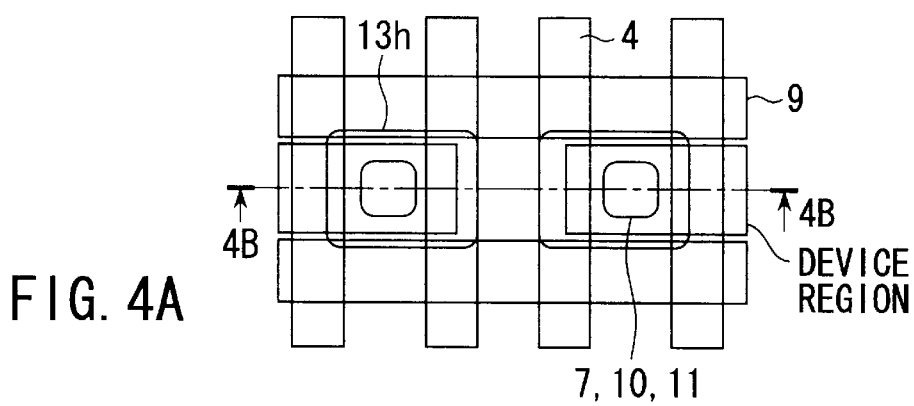
FIG. 4A is a plan view showing a second step for manufacturing the memory cell of the stack-type DRAM according to the first embodiment.
Figure 4B:
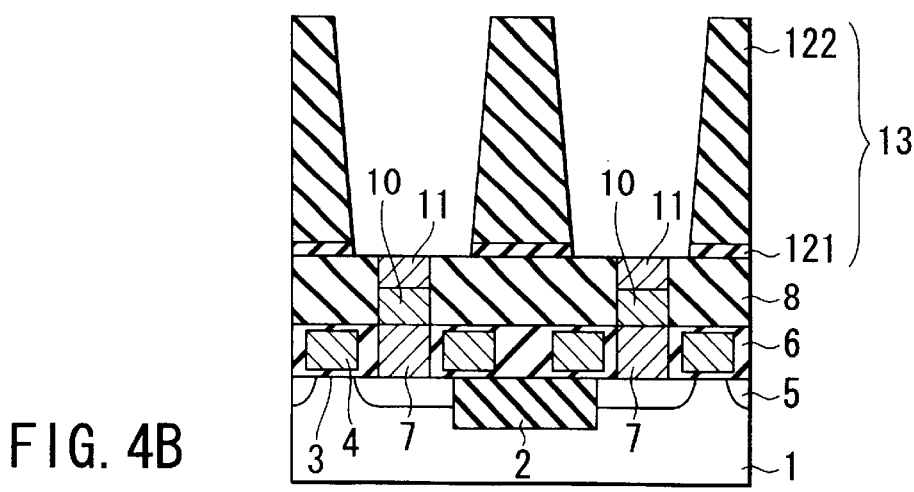
FIG. 4B is a cross-sectional view showing the second step for manufacturing the memory cell of the stack-type DRAM according to the first embodiment.
Figure 5A:
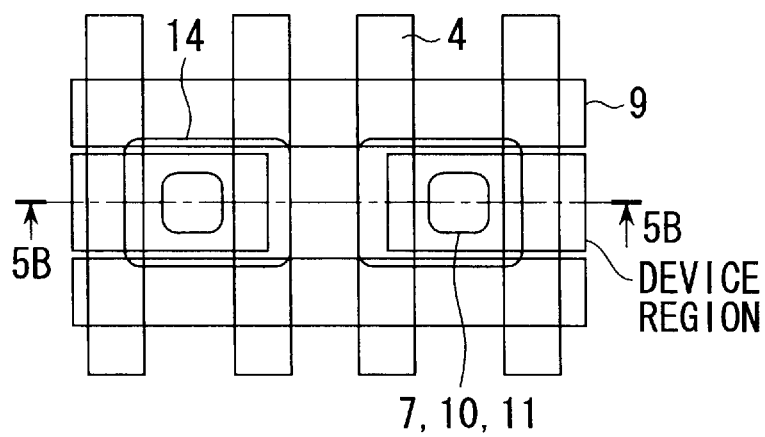
FIG. 5A is a plan view showing a third step for manufacturing the memory cell of the stack-type DRAM according to the first embodiment.
Figure 5B:
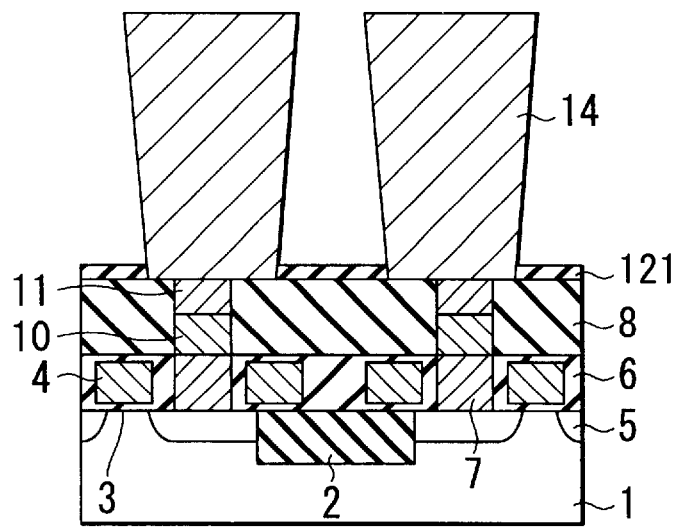
FIG. 5B is a cross-sectional view showing the third step for manufacturing the memory cell of the stack-type DRAM according to the first embodiment.

A method for manufacturing a DRAM memory cell having the PL electrode structure as described above will now be described with reference to FIGS. 2A, 2B, 3A, 3B, 4A, 4B, 5A and 5B. FIGS. 3A, 4A and 5A are plan views corresponding to FIG. 2A. FIGS. 3B, 4B and 5B are cross-sectional views corresponding to FIG. 2B.

In the following description, it is assumed that N-channel MOS transistors are used both in a memory cell portion and a peripheral circuit portion. A DRAM cell structure having P-channel MOS transistors, instead of the MOS transistors, can be manufactured in the same manner.

First, as shown in FIG. 3B, a P-type silicon substrate (or N-type silicon substrate) 1 of an impurity concentration of about $5 \times 10^{15} cm^{-3}$ is prepared. On the (100) plane of the silicon substrate 1, a P well is formed in an N-channel transistor region and an N well is formed in a P-channel transistor region (not shown).

Then, a trench (having a depth of about 0.2 $\mu$m) is formed in the silicon substrate 1 by, for example, reactive ion etching (RIE). An element isolating insulating film 2 is buried in the trench, thereby achieving element isolation by STI (Shallow Trench Isolation).

Next, a gate oxide film 3 of a thickness of about 50 nm is formed as a gate insulating film of the MOS transistor. A conductive film, which is to be a gate electrode 4, is formed on the gate oxide film 3 (in the memory cell portion, the conductive film is to be a word line). If the gate electrode 4 of a so-called polycide structure is formed to reduce the resistance, a laminated film made of a polysilicon film and a $WSi_2$ film, each having a thickness of about 50 nm, is formed as the conductive film. If the gate electrode 4 of a polymetal structure is formed, a laminated film made of a polysilicon film and a tungsten (W)/tungsten nitride (WN) film is formed as the conductive film. Alternatively, the conductive film may be a single layer of polysilicon film.

Then, a gate cap layer (not shown) made of a silicon nitride ($Si_3N_4$) is formed on the conductive film. The gate cap layer serves as an etching stopper for preventing the gate electrode 4 from being etched in a process of self-alignment (to be described later). A resist pattern (not shown) is formed on the gate cap layer. Using the resist pattern as a mask, the gate cap layer is etched. Thereafter, using the gate cap layer as a mask, the conductive film is etched to form the gate electrode 4.

In order to improve the withstand voltages of the gate electrode 4 and an impurity diffusion layer of a low-impurity concentration (formed in a later process), rapid thermal oxidation (RTO) is performed, for example, at the temperature of 1050° C. in an oxygen atmosphere for about 100 seconds. As a result, a post-oxidation film (not shown) is formed.

Thereafter, using the aforementioned resist pattern (not shown) and the gate electrode 4 as a mask, n-type impurity ions are injected into a surface region of the silicon substrate 1, thereby forming a shallow low-impurity concentration region (extension) of an n-type source/drain region 5.

Then, a silicon nitride film ($Si_3N_4$) (not shown) of a thickness of about 20 nm is deposited on the above structure by LP-CVD. Subsequently, the overall surface is etched by RIE, thereby forming a so-called side wall spacer film (not shown) on a side wall portion of the gate electrode 4. Thereafter, using the resist pattern, the side wall spacer film and the gate electrode 4 as a mask, n-type impurity ions are injected into a surface region of the silicon substrate 1, thereby forming a deep high-impurity concentration region of the n-type source/drain region 5. The n-type source/drain region 5 is subjected to annealing in order to activate the impurities therein. The low-impurity region and the high-impurity region may be subjected to annealing simultaneously or separately.

A silicon nitride film ($Si_3N_4$ film of a thickness of, for example, about 20 nm) (not shown), which serves as an etching stopper, is deposited on the above structure again by LP-CVD. Then, a BPSG film as an interlayer insulating film 6, of a thickness of, for example, 500 nm, is deposited on the above structure by CVD. The interlayer insulating film 6 on the gate cap layer (the silicon nitride film) is polished and flattened by CMP (Chemical Mechanical Polishing) to a thickness of about 100 nm. As a result of the flattening by CMP, the overall surface of the substrate (wafer) is flattened substantially entirely.

Thereafter, a resist pattern (not shown) for forming a contact hole is deposited on the interlayer insulating film 6. Using the resist pattern as a mask, the interlayer insulating film 6 is etched, thereby forming a contact hole in the interlayer insulating film in order to establish a contact between the n-type source/drain region 5 on one hand and the bit line and the SN electrode on the other.

The etching for forming the contact hole is performed in a self-aligning manner by means of high-selection ratio RIE, in which the etching rate of the BPSG film as the interlayer insulating film 6 is ten times faster than that of the etching stopper (the gate cap layer made of $Si_3N_4$). This process prevents a short circuit between the gate electrode 4 and a plug buried in the contact hole in a later process. As a result, the yield of the products can be improved.

An $n^+$-type polysilicon film doped with phosphorus ($P^+$) or arsenic ($As^+$) as impurities is deposited on the above structure by LP-CVD. An unnecessary portion of the $n^+$-type polysilicon film outside the contact hole is removed by etching-back by CMP or RIE. As a result, the contact hole is filled with an SN polysilicon plug 7 made of the $n^+$-type polysilicon. The SN polysilicon plug 7 is electrically connected to the n-type source/drain region 5. The SN polysilicon plug 7 and the source region form an SN contact portion, and the SN polysilicon plug and the drain region from a BL contact portion.

Next, a BPSG film of a thickness of about 300 nm, which serves as an interlayer insulating film 8, is deposited on the above structure by CVD. Thereafter, a TEOS oxide film (not shown) of a thickness of about 100 nm, which serves as an etching stopper when CMP is performed, is deposited on the interlayer insulating film by CVD.

A line groove (of a depth of about 350 nm) for forming a bit line is formed in a laminated insulating film made of the interlayer insulating film 8 and the TEOS oxide film. In a bit line contact region including the groove, a contact hole (not shown), extending to the SN polysilicon plug 7, is formed in the laminated insulating film. Thereafter, a bit line 9 electrically connected to the SN polysilicon plug 7 is formed.

The bit line 9 is formed in a so-called dual damascene process employing CMP, in which a laminated conductive film to be the bit line 9, formed of, for example, W/TiN/Ti film, is buried in the line groove.

The surface of the bit line 9 buried in the line groove is 100 nm etched, for example. Then, a silicon nitride film (not shown) of a thickness of about 300 nm is deposited on the above structure. Thereafter, the portion of the silicon nitride film outside the line groove is removed by CMP or CDE (Chemical Dry Etching). As a result, the recess portion formed by removing the surface of the bit line 9 is filled with the silicon nitride film.

At this time, a contact hole and a line groove for forming a bit line in the memory cell portion are also formed in a contact region of the peripheral circuit portion by the conventional lithography and RIE, before the laminated conductive film formed of the W film, etc. is buried. With this process, when a bit line contact and a bit line portion are filled with the W film or the like by the dual damascene process, a contact plug (not shown) electrically connected to the source/drain diffusion layer is formed in the contact region of the peripheral circuit portion at the same time.

Then, a contact hole extending to the SN polysilicon plug 7 is formed in the interlayer insulating film 8 by the conventional lithography and RIE. A laminated film, for example, a W/TiN/Ti film, is deposited on the above structure. The portion of the W/TiN/Ti film outside the contact hole is removed by CMP or the like, thereby forming an SN metal plug 10 made of the W/TiN/Ti film buried in the contact hole (in the drawings, the SN metal plug is shown as a single-layer film).

The SN metal plug 10 is electrically connected to the source/drain diffusion region 5 through the SN polysilicon plug 7. In the above process of forming the contact hole, a desired fine contact hole may be formed in a narrow region between bit lines using an SiN film (not shown) on the bit line 9 and a resist (not shown) as a mask. At this stage, both the metal cell portion and the peripheral circuit portion (not shown) have been flattened.

Thereafter, the surface of the SN metal plug 10 is about 100 nm removed by etching. The removed portion may be filled with a barrier metal film 11 (for example, a TiN film). The drawings show the case in which the barrier metal film 11 is buried in the removed portion.

Subsequently, as shown in FIGS. 4A and 4B, a silicon nitride film ($Si_3N_4$ film) 121 of a thickness of about 50 nm and a plasma TEOS oxide film 122 of a thickness of about 400 nm are successively formed on the above structure to form an SN groove pattern 13 for forming an SN electrode. The SN groove pattern 13 has a cavity in an SN electrode forming region. In the drawing, a reference numeral 13h denotes a cavity in the SN groove pattern 13.

Next, a resist pattern (not shown) having a cavity in the SN electrode forming region is deposited on the plasma TEOS oxide film 122. Using the resist pattern as a mask, the plasma TEOS oxide film 122 and the silicon nitride film 121 are successively etched by RIE. The etching exposes a surface of the barrier metal 11 selectively formed on the SN metal plug 10 buried in the interlayer insulating film 8. Thereafter, the resist pattern (not shown) is removed.

The side walls of the SN groove pattern 13 tend to be forward-tapered with respect to the surface of the substrate. The etching conditions may be adjusted so that the side walls can be substantially perpendicular to the surface of the substrate. The term "forward-tapered" represents a state in which the distance between the side walls of the adjacent plasma TEOS oxide films 122 is narrower near the barrier metal film 11 and becomes wider as the distance from the barrier metal film 11 increases, as shown in FIG. 4B.

An Ru film of a thickness of about 400 nm, to be an SN electrode 14, is deposited on the above structure by CVD. Thereafter, the portion of the Ru film outside the hole in the SN groove pattern 13 is removed by, for example, CMP or etching-back, thereby flattening the surfaced of the structure. As a result, the SN electrode 14 made of the Ru film, selectively buried in the hole of the SN groove pattern 13, is obtained. The formation of the Ru film by CVD is carried out in an oxygen atmosphere at a temperature of, for example, 320° C., using material, such as $Ru(EtCp)_2$ or $Ru(Cp)_2$. Thus, the Ru film of a satisfactory coverage can be buried in the elongated groove (SN groove pattern 13).

In this embodiment, a metal film made of Ru is used as a material of the SN electrode 14. However, the SN electrode 14 may be made of another metal film or metal oxide film, for example, $RuO_2$, Pt, Re, Os, Pd, Rh, Au, Ir, $IrO_2$, TiN, WN, or a metal oxide having a perovskite crystal structure, for example, a metal film mainly composed of SRO ($SrRuO_3$). Grains of each metal film may be stuffed with another metal material, for example, Rh or Ir, or an oxide of metal material.

The region from which the plasma TEOS oxide film 122 should not be removed, for example, the peripheral circuit portion, is covered by a resist (not shown). Thereafter, the plasma TEOS oxide film 122 is selectively etched by means of wet etching with, for example, an $NH_4F$ solution, or by means of the combination of RIE and wet etching. As a result, the structure shown in FIGS. 5A and 5B is formed.

The etching is stopped at the silicon nitride film 121 under the plasma TEOS oxide film 122. As a result, the top surface of the SN electrode 14 in the memory cell portion is aligned with the top surface of the plasma TEOS oxide film 122 in the other portion. In other words, there is substantially no difference in height between the memory cell portion and the other portion regardless of whether the SN electrode 14 is present or not. In the process of manufacturing a stack-type DRAM, it is important to minimize the difference in height between the elements.

Alternatively, the plasma TEOS oxide film 122 on the overall substrate (wafer) may be selectively removed. In this case, the memory cell portion and the peripheral circuit portion become different in height. However, an oxide film is formed on the overall structure in a later process, and the surface of the oxide film is flattened by CMP or the like. Therefore, no problem arises in this case also.

The side surface of the SN electrode 14 corresponds to the inner surface of the hole formed by etching the plasma TEOS oxide film 122. Since the etched surface of the oxide film is relatively smooth, the side surface of the SN electrode 14 is also smooth. Therefore, electric field concentration, which may occur owing to roughness of the side surface of the SN electrode 14, can be reduced. If electric field concentration occurs, the leak current of the capacitor insulating film may increase. Therefore, this embodiment can suppress an increase in leak current of the capacitor insulating film.

In contrast, if the SN electrode is formed by etching a metal film, the side surface of the SN electrode will be rough, since the metal film is not easily etched. Therefore, it is impossible to suppress the increase in leak current of the capacitor insulating film.

Then, as shown in FIGS. 2A and 2B, a capacitor insulating film 15, made of, for example, BST, is deposited on the above structure to a thickness of about 20 nm by, for example, a film-forming process (CVD) at a temperature of about 500° C. and a crystallizing anneal process at a temperature of about 650° C. Thereafter, for example, an Ru film to serve as a PL electrode 16 (a common electrode) is deposited on the capacitor insulating film 15 to a thickness of about 40 nm by, for example, CVD.

At this time, the PL electrode 16 is formed so as to have a cavity 17 in a region between the two adjacent SN electrodes 14. The formation of the PL electrode 16 having the cavity 17 prevents degradation in characteristic or reliability of the capacitor in a heat process performed later.

In this embodiment, SN electrodes 14 having the side surfaces (in cross section) backward-tapered with respect to the surface of the substrate are formed, with the result that the cavity 17 is formed in the PL electrode 16. In this case, the Ru film to serve as the PL electrode 16 can be formed in the conventional film forming conditions. It is preferable that the cross section of the cavity 17 is triangular, as shown in FIG. 2B. The term "backward-tapered" represents a state in which the width of the SN electrode 14 is narrower near the barrier metal film 11 and becomes wider as the distance from the barrier metal film 11 increases, as shown in FIG. 2B.

Figure 6:
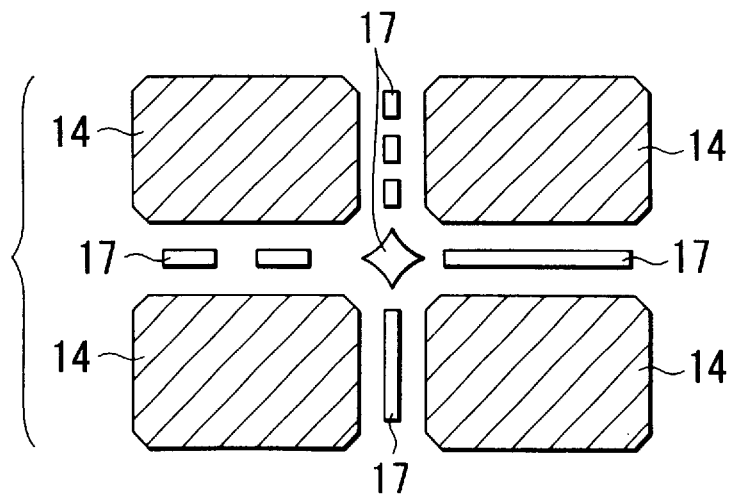
FIG. 6 is a cross-sectional view showing a shape of a cavity formed in a plate electrode of the memory cell of the stack-type DRAM according to the first embodiment.

FIG. 6 is a cross-sectional view taken along the line 6—6 in FIG. 2B. This is a schematic view showing a cross section of the cavity 17 on a plane parallel to the surface of the substrate. As shown in FIG. 6, it is only necessary that the cavity 17 be present between the adjacent SN electrodes 14. A plurality of cavities 17 may be scattered therebetween. The cavity 17 present in a region surrounded by corners of four SN electrodes 14 tends to be diamond-shaped. As described above, it is only necessary that the cavity 17 is present between the adjacent SN electrodes 14. However, the cavity 17 may be present also within the PL electrode 16. Alternatively, it may present only within the PL electrode 16. Further, the cavities 17 need not be present in all the regions between SN electrodes 14, but may be present in a part of the regions.

The Ru film serving as the PL electrode 16, formed at a low temperature (320° C.), induces grain growth in the heat process later at a temperature of about 450° C. As a result, a stress change occurs due to a structural change, and the film stress is increased. However, the cavity 17 present in the Ru film serving as the PL electrode 16 can reduce the residual stress remaining after the heat process.

The subsequent steps are the same as those for producing the conventional stack-type DRAM. For example, a TiN film (not shown), to serve as a cap layer, is formed on the above structure to a thickness of about 50 nm by, for example, sputtering. Thereafter, the cap layer and the PL electrode 16 are patterned by the conventional lithography and RIE or the like (not shown).

In this embodiment, the PL electrode 16 is made of the Ru film. However, it may be made of another metal film mainly composed of a precious metal, for example, TiON, TiN, Pt, Re, Ir, Os, Pd, Rh, Au, or metal oxide film thereof, or a metal oxide mainly composed of a perovskite-type metal oxide, such as SRO.

Although the capacitor insulating film 15 is made of the BST film in this embodiment, it may be made of a film having a high-dielectric constant, mainly composed of, a high-k material, such as $SrTiO_3$, $Ta_2O_5$ or $Al_2O_3$, which has a dielectric constant higher than that of a silicon oxide (3.9). In the case where $SrTiO_3$ is used, the capacitor insulating film is formed by, for example, CVD at about 500° C. and crystallizing anneal at about 600° C. In the case where $Ta_2O_5$ is used, the capacitor insulating film is formed by, for example, CVD at about 500° C. and UV-03 annealing. As the memory size is reduced, the space between the SN electrodes 14 is narrower. Therefore, it is preferable that the capacitor insulating film may be made of a film that can suppress the leak current even if the thickness thereof is reduced.

After an interlayer insulating film (not shown) is deposited, a contact hole is formed in a desired region and a metal wire is formed. If necessary, these steps (depositing an interlayer insulating film, forming a contact hole, and a forming a metal wire) may be repeated to obtain a multi-wire structure. Thereafter, a pad contact is formed, with the result that a DRAM is completed.

Second Embodiment

Figure 7A:
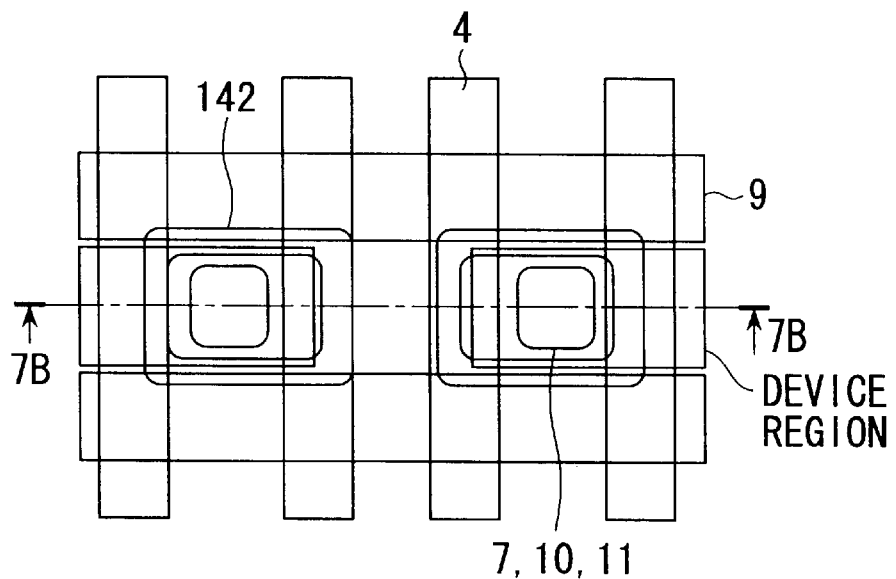
FIG. 7A is a plan view of a memory cell of a stack-type DRAM according to a second embodiment of the present invention.
Figure 7B:
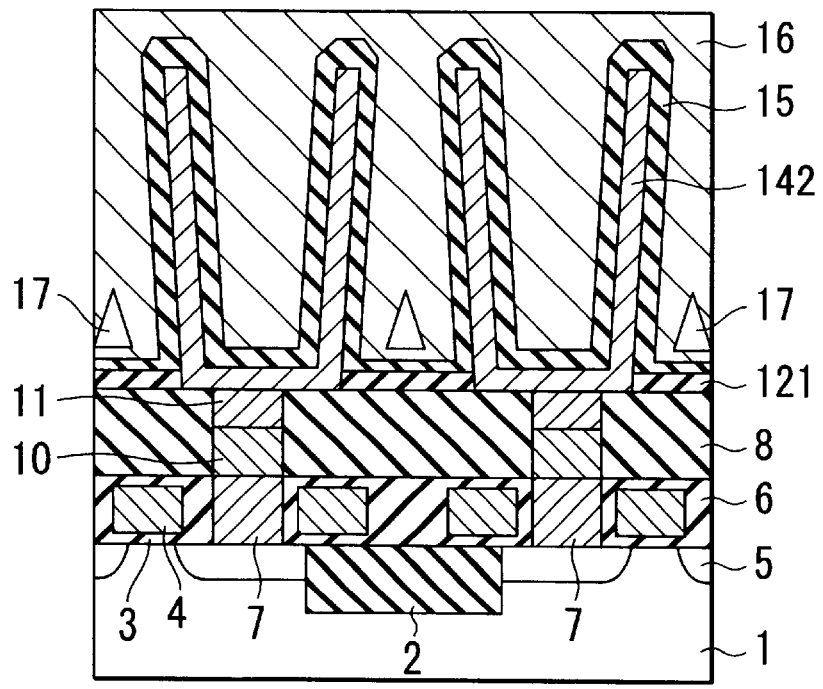
FIG. 7B is a cross-sectional view of the memory cell of the stack-type DRAM according to the second embodiment.

FIG. 7A is a plan view of a memory cell of a stack-type DRAM according to a second embodiment of the present invention. FIG. 7B is a cross-sectional view of the memory cell taken along the line 7B—7B in FIG. 7A. The portions which are the same as or equivalent to those shown in FIGS. 2A and 2B are identified by the same reference numerals as those in FIGS. 2A and 2B, and detailed descriptions thereof will be omitted. In the other drawings, the same reference numerals denote the same or equivalent portions as those shown in the preceding drawings, and detailed descriptions thereof fill be omitted.

The second embodiment is structurally different from the first embodiment in the shape of the SN electrode. More specifically, the SN electrode 14 of the first embodiment is a substantially rectangular solid, whereas the SN electrode 142 of the second embodiment has a hollow shape, for example, a cylinder-type. As in the first embodiment, the side wall of the SN electrode 142 (in cross section) is backward-tapered with respect to the surface of the substrate. The term "backward-tapered" represents a state in which the distance between the adjacent electrodes sandwiching the PL electrode 16 is narrower near the barrier metal film 11 and becomes wider as the distance from the barrier metal film 11 increases, as shown in FIG. 7B.

The difference in process between the first and second embodiment, resulting from the above structural difference, is as follows. In the first embodiment, after the process shown in FIG. 4B, the conductive film to serve as the SN electrode 14 (thickness:

about 400 nm) is deposited to fill in the SN groove pattern 13. In the second embodiment, a conductive film to serve as the SN electrode film 142 (thickness: about 30 nm) is deposited on the structure shown in FIG. 4B to coat the inner wall of the SN groove pattern 13. Therefore, the SN groove pattern 13 is not filled with the conductive film.

A method for producing a memory cell of a stack-type DRAM according to the second embodiment will be described in detail. Since the steps to obtain the structure shown in FIGS. 4A and 4B are the same as those of the first embodiment, the descriptions thereof will be omitted.

As shown in FIG. 4B, the SN groove pattern 13 is formed, in which the side wall is forward-tapered with respect to the surface of the substrate. Then, the surface of the barrier metal 11 on the bottom of the SN groove pattern 13 is exposed.

Figure 8A:
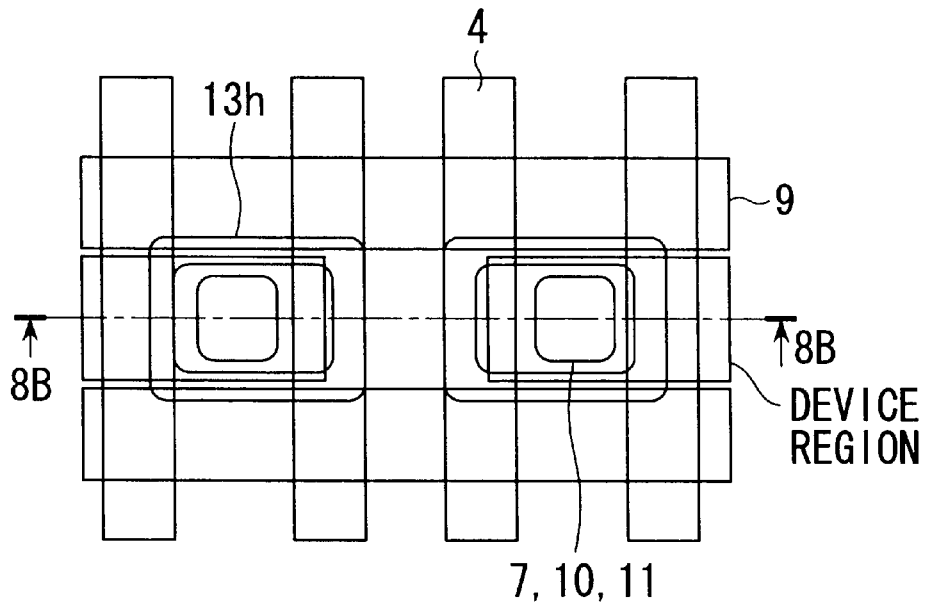
FIG. 8A is a plan view showing a first step for manufacturing the memory cell of the stack-type DRAM according to the second embodiment.
Figure 8B:
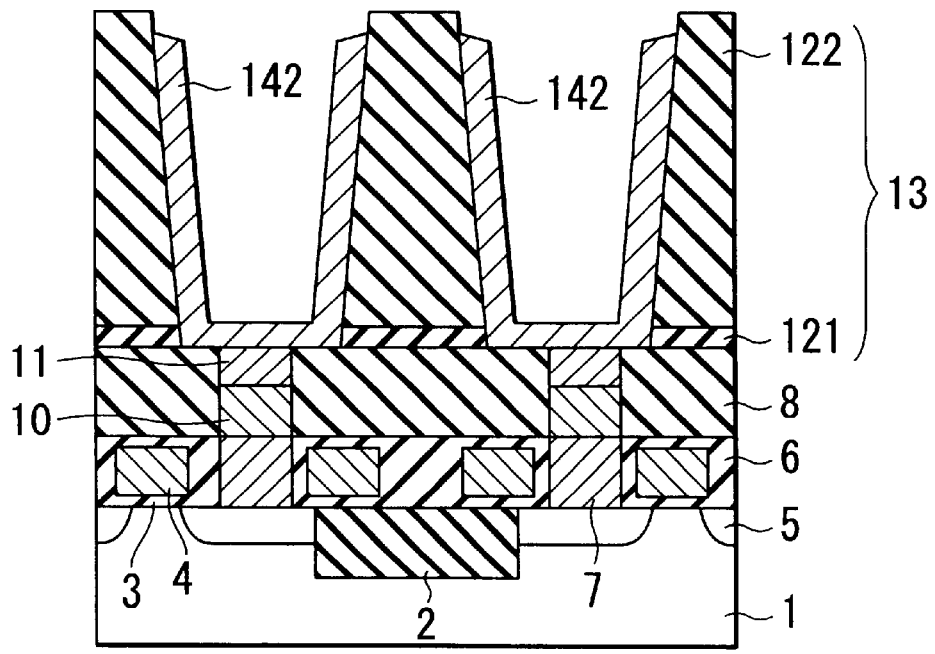
FIG. 8B is a cross-sectional view showing the first step for manufacturing the memory cell of the stack-type DRAM according to the second embodiment.

Subsequently, an Ru film of a thickness of, for example, about 30 nm, to serve as the SN electrode 142, is deposited on the above structure by CVD. Then, the unnecessary portion of the Ru film is removed by, for example, CMP or etching-back, to flatten the surface. As a result, the inner wall of the SN groove pattern 13 is coated with the Ru film, as shown in FIGS. 8A and 8B. Thus, the SN electrode 142 is formed, in which the side wall (in cross section) is backward-tapered with respect to the surface of the substrate.

At this time, a protecting film, such as a resist (not shown), may be used to protect the surface of the Ru film on the inner wall of the SN electrode 142 from damage or contamination in the CMP process. The protecting film is removed after the CMP process is completed. In this embodiment, the Ru film is used as the SN electrode 142; however, any other metal film as described in the above section of the first embodiment may be used instead.

Figure 9A:
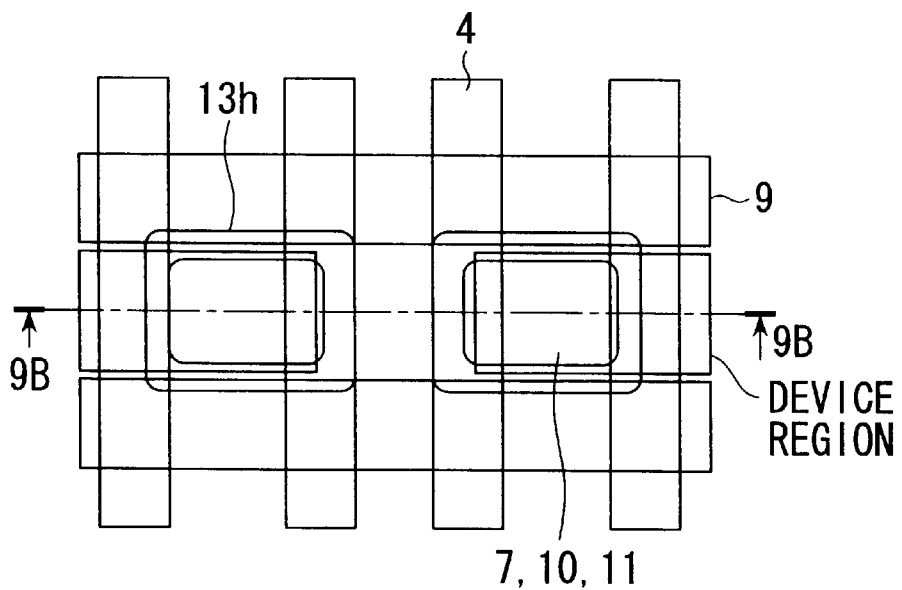
FIG. 9A is a plan view showing a second step for manufacturing the memory cell of the stack-type DRAM according to the second embodiment.
Figure 9B:
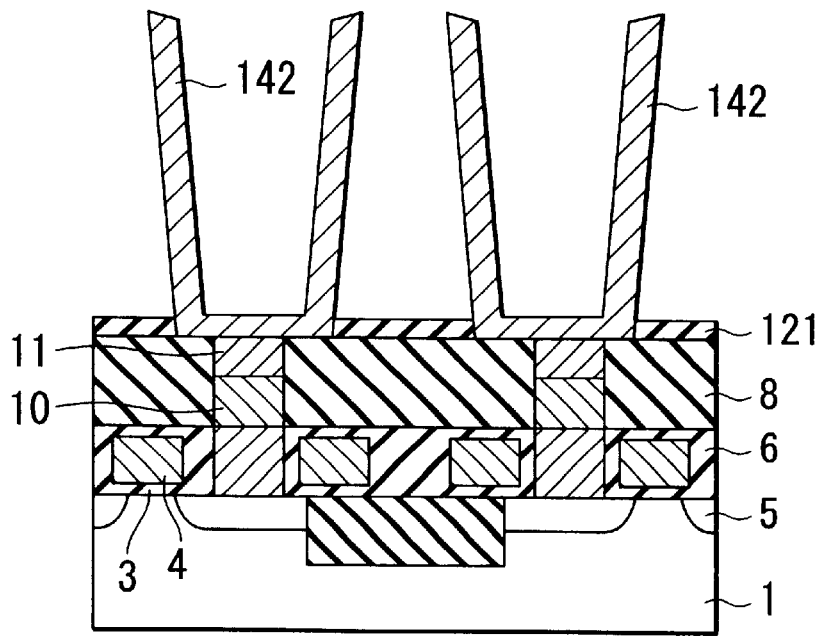
FIG. 9B is a cross-sectional view showing the second step for manufacturing the memory cell of the stack-type DRAM according to the second embodiment.

The region from which the plasma TEOS oxide film 122 should not be removed, for example, the peripheral circuit portion, is covered by a resist (not shown). Thereafter, the plasma TEOS oxide film 122 is selectively etched by means of wet etching with, for example, an NH$_4$F solution, or by means of the combination of RIE and wet etching. As a result, the structure shown in FIGS. 9A and 9B is formed. The etching is stopped at the silicon nitride film 121 under the plasma TEOS oxide film 122. Thus, the top surface of the SN electrode 142 in the memory cell portion is aligned with the top surface of the plasma TEOS oxide film 122 in the other portion. In other words, there is substantially no difference in height between the memory cell portion and the other portion regardless of whether the SN electrode 142 is present or not. In the process of manufacturing a stack-type DRAM, it is important to minimize the difference in height of the elements.

Alternatively, the plasma TEOS oxide film 122 on the overall substrate (wafer) may be selectively removed. In this case, the memory cell portion and the peripheral circuit portion become different in height. However, no problem arises in this case for the reason as described before in the section of the first embodiment.

Thus, the SN electrode 142 having a hollow shape (for example, a cylindrical hollow shape) is formed, in which the side wall is backward-tapered with respect to the surface of the substrate. As in the case of the first embodiment, the side surface of the SN electrode 142 is smooth. Therefore, electric field concentration, which may occur owing to roughness of the side surface of the SN electrode 142, can be reduced.

Thereafter, as shown in FIG. 7B, a capacitor insulating film 15 made of, for example, BST, is deposited on the above structure to a thickness of about 20 nm by CVD. Then, for example, an Ru film to serve as a PL electrode 16 is deposited on the capacitor insulating film 15 to a thickness of about 40 nm by, for example, CVD.

At this time, the Ru film is deposited such that a cavity 17 is formed within the PL electrode 16 in a region between the adjacent SN electrodes 142. As in the case of the first embodiment, the SN electrodes 142, which have the side surfaces backward-tapered with respect to the surface of the substrate, are formed. As a result, the cavity 17 is formed in the PL electrode 16.

The subsequent steps are the same as those for producing the conventional stack-type DRAM, as in the case of the first embodiment. Further, the PL electrode 16 may be made of another conducive film and the capacitor insulating film 15 may be made of another conductive film as described before in the section of the first embodiment.

In the second embodiment, the same effect as in the first embodiment can be obtained. In particular, according to the second embodiment, the heat stress on the thin side wall of the SN electrode, having a hollow shape (for example, a hollow cylindrical shape), can be effectively reduced by the cavity 17 in the PL electrode 16. As a result, peeling of the cylindrical SN electrode 142 is prevented, which was difficult in the conventional art. Therefore, the manufacturing yield of the capacitor can be improved.

Figure 10A:
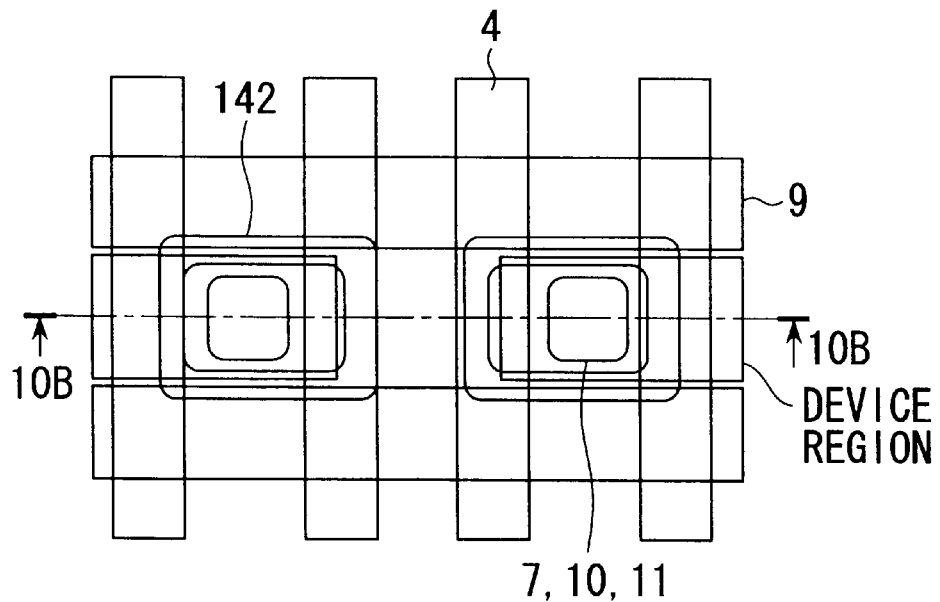
FIG. 10A is a plan view of a memory cell of a stack-type DRAM according to a modification of the second embodiment of the present invention.
Figure 10B:
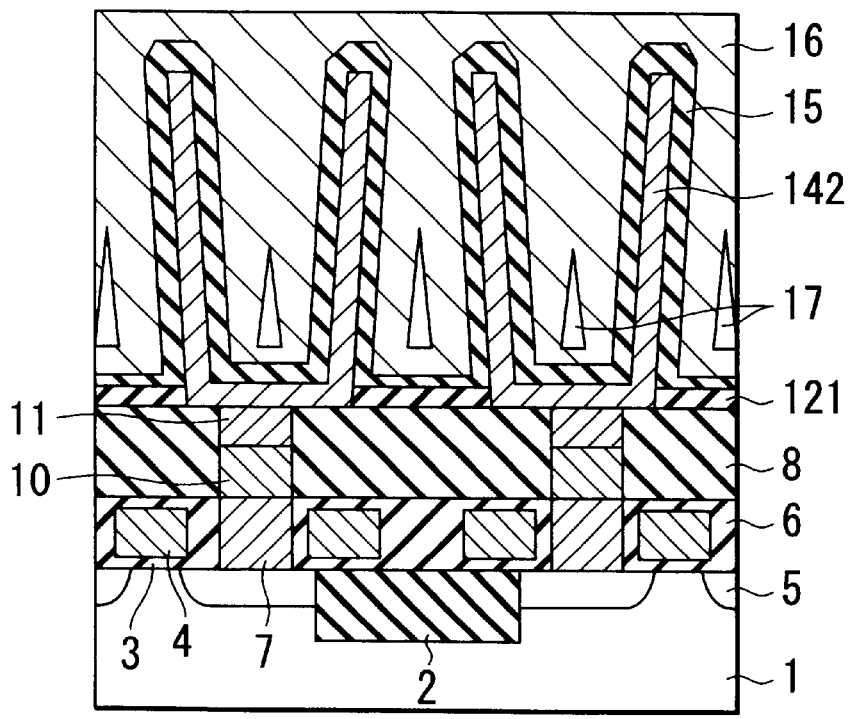
FIG. 10B is a cross-sectional view of the memory cell of the stack-type DRAM according to the modification of the second embodiment.

FIGS. 10A and 10B show a modification of the second embodiment. In the second embodiment, the cavity 17 is formed in the portion of PL electrode 16 interposed between the two adjacent SN electrodes 142. In the modification, as shown in FIG. 10B, a cavity 17 is additionally formed in that portion of the PL electrode 16 inside the hollow (hollow cylindrical) SN electrode 142. In this case, the height of the cylindrical portion (the SN electrode 142) and film forming conditions for forming the PL electrode 16 are suitable set, so that the cavities 17 are formed inside and outside the cylinder. The effect of the modification is the same as that of the second embodiment.

Third Embodiment

Figure 11A:
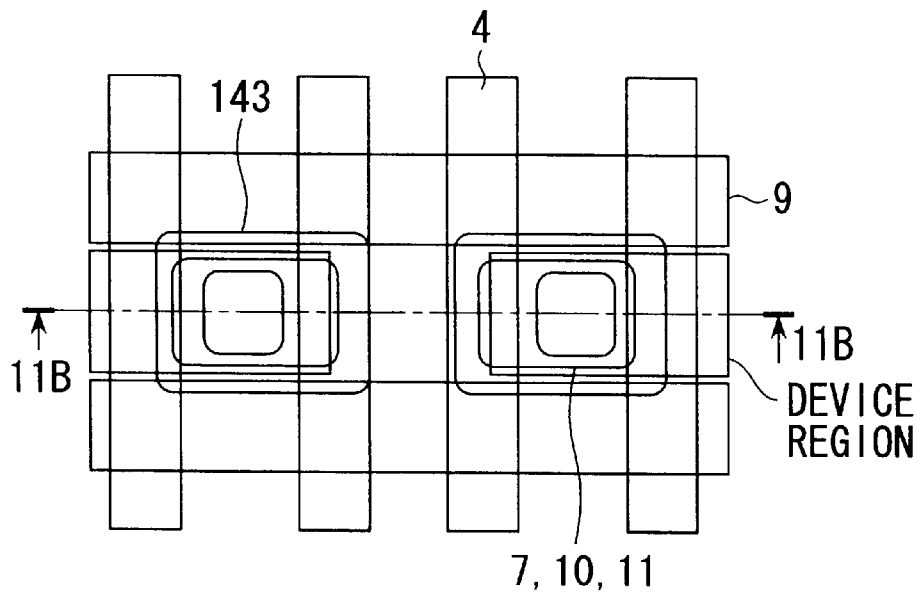
FIG. 11A is a plan view of a memory cell of a stack-type DRAM according to a third embodiment of the present invention.
Figure 11B:
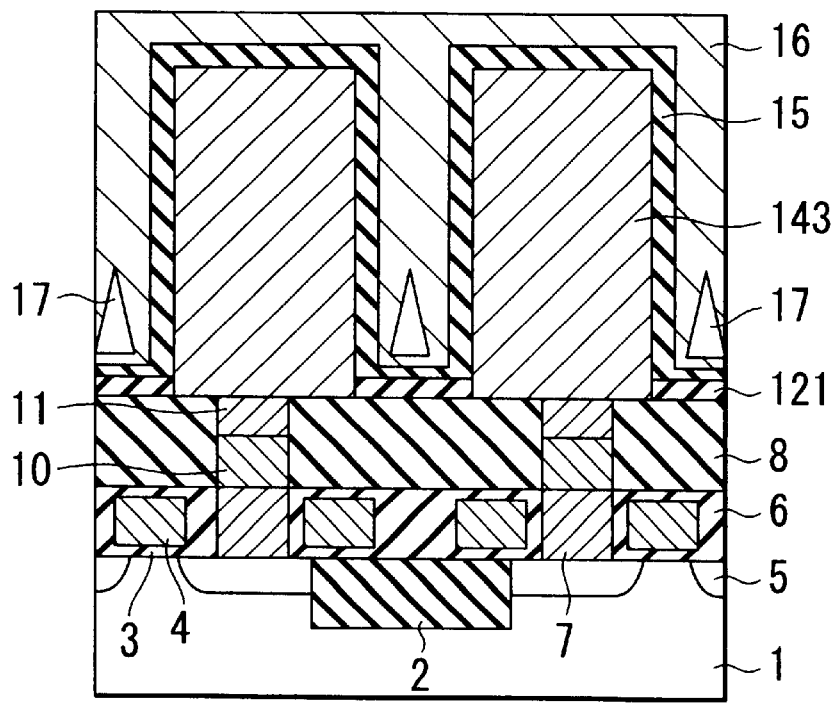
FIG. 11B is a cross-sectional view of the memory cell of the stack-type DRAM according to the third embodiment.

FIG. 11A is a plan view of a memory cell of a stack-type DRAM according to a third embodiment of the present invention. FIG. 11B is a cross-sectional view of the memory cell taken along the line 11B—11B in FIG. 11A.

The third embodiment is structurally different from the first embodiment in the shape of the SN electrode. More specifically, the SN electrode 14 of the first embodiment has a rectangular shape, in which the side wall (in cross section) is backward-tapered with respect to the surface of the substrate. In contrast, an SN electrode 143 of the third embodiment has a rectangular parallelepiped shape, in which the side wall (in cross section) is substantially perpendicular to the surface of the substrate.

A method for producing a memory cell having the SN electrode 143 will be described. Since the steps to obtain the structure shown in FIGS. 3A and 3B are the same as those of the first embodiment, the descriptions thereof will be omitted.

Figure 12A:
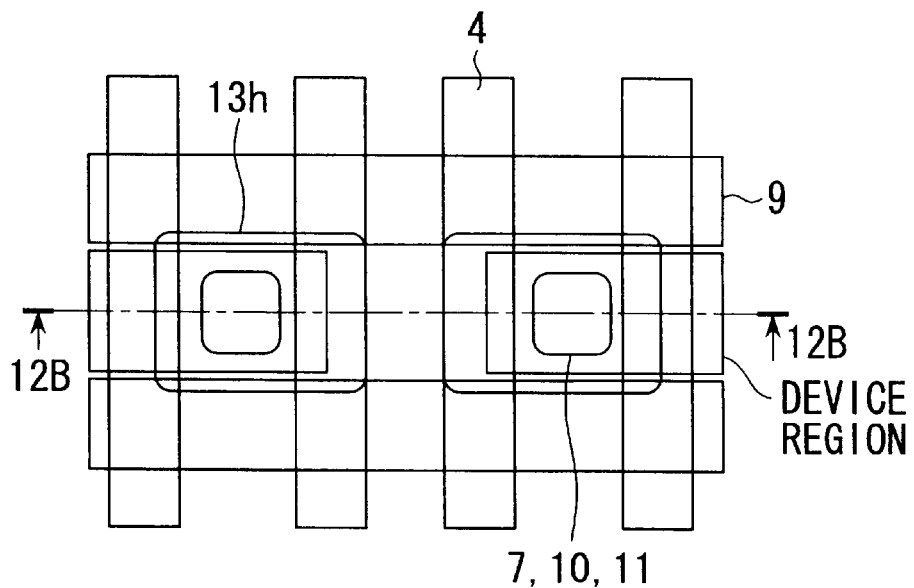
FIG. 12A is a plan view showing a first step for manufacturing the memory cell of the stack-type DRAM according to the third embodiment.
Figure 12B:
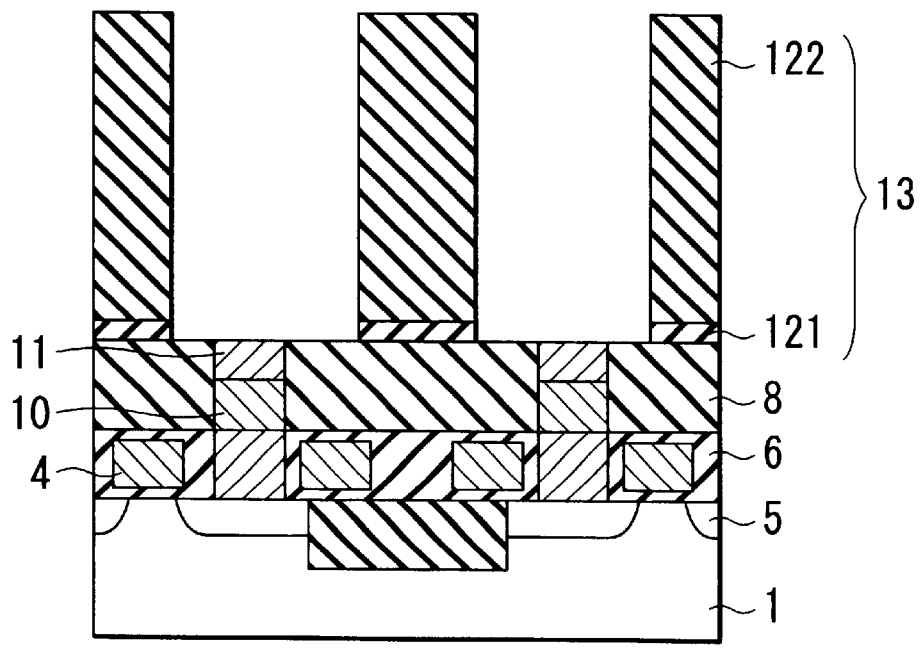
FIG. 12B is a cross-sectional view showing the first step for manufacturing the memory cell of the stack-type DRAM according to the third embodiment.

Subsequently to the step shown in FIG. 3B, an SN groove pattern 13 is formed, in which the side wall is substantially perpendicular to the surface of the substrate, as shown in FIGS. 12A and 12B. Then, the surface of the barrier metal 11 on the bottom of the SN groove pattern 13 is exposed.

Figure 13A:
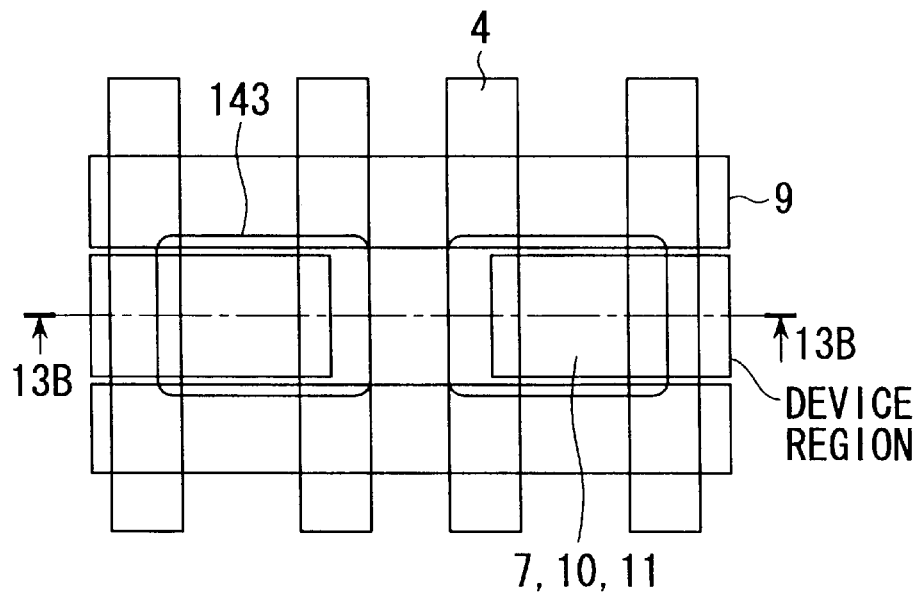
FIG. 13A is a plan view showing a second step for manufacturing the memory cell of the stack-type DRAM according to the third embodiment.
Figure 13B:
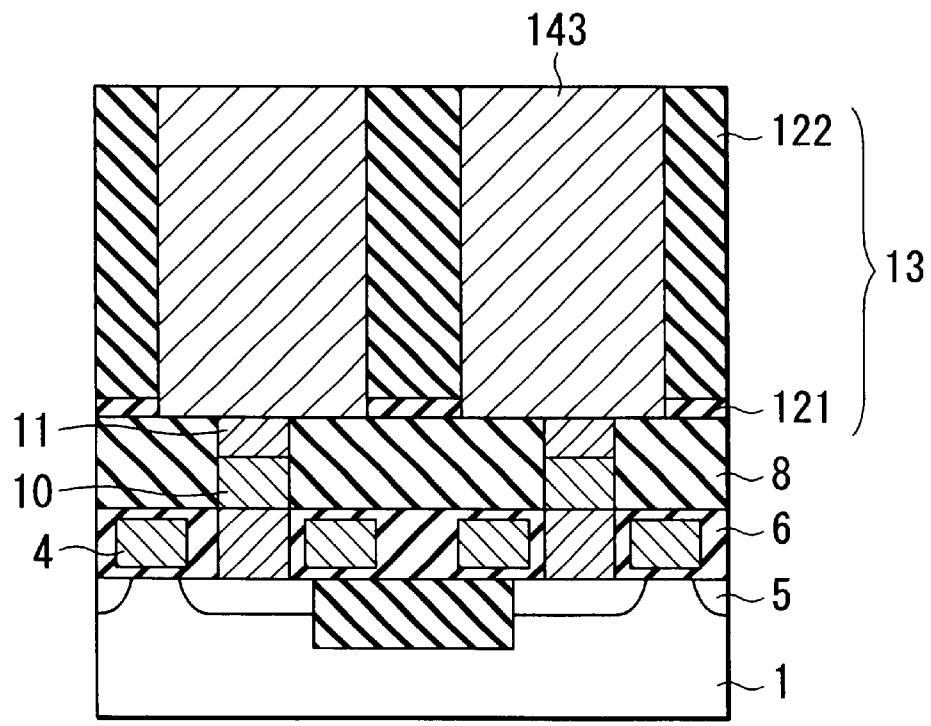
FIG. 13B is a cross-sectional view showing the second step for manufacturing the memory cell of the stack-type DRAM according to the third embodiment.

Thereafter, an Ru film of a thickness of, for example, about 300 nm, to serve as the SN electrode 143, is deposited on the overall surface by CVD. Then, the unnecessary portion of the Ru film is removed by, for example, CMP or etching-back, to flatten the surface. As a result, the SN groove pattern 13 is completely filled with the SN electrode 143, as shown in FIGS. 13A and 13B. In this embodiment, the Ru film is used as the SN electrode 143; however, any other metal film as described in the above section of the first embodiment may be used instead.

The region from which the plasma TEOS oxide film 122 should not be removed, for example, the peripheral circuit portion, is covered by a resist (not shown). Thereafter, the plasma TEOS oxide film 122 is selectively etched by means of wet etching with, for example, an NH$_4$F solution, or by means of the combination of RIE and wet etching.

The etching is stopped at the silicon nitride film 121 under the plasma TEOS oxide film 122. Thus, the top surface of the SN electrode 143 in the memory cell portion is aligned with the top surface of the plasma TEOS oxide film 122 in the other portion. In other words, there is substantially no difference in height between the memory cell portion and the other portion regardless of whether the SN electrode 143 is present or not. In the process of manufacturing a stack-type DRAM, it is important to minimize the difference in height of the elements.

Alternatively, the plasma TEOS oxide film 122 on the overall substrate (wafer) may be selectively removed. In this case, the memory cell portion and the peripheral circuit portion become different in height. However, no problem arises in this case for the reason as described before in the section of the first embodiment.

Thus, the SN electrode 143, having a so-called box shape, is formed in which the side wall is substantially perpendicular to the surface of the substrate. As in the case of the first embodiment, the side surface of the SN electrode 143 is smooth. Therefore, electric field concentration, which may occur owing to roughness of the side surface of the SN electrode 143, can be reduced.

Thereafter, as shown in FIG. 11B, a capacitor insulating film 15 made of, for example, BST, is deposited on the above structure to a thickness of about 20 nm by CVD. Then, for example, an Ru film to serve as a PL electrode 16 is deposited on the capacitor insulating film 15 to a thickness of about 40 nm by, for example, CVD.

At this time, the Ru film is deposited such that a cavity 17 is formed within the PL electrode 16 in a region between the adjacent SN electrodes 143. Unlike in the first embodiment, the SN electrodes 143 is box-shaped, in which the side surfaces are substantially perpendicular to the surface of the substrate. Therefore, the Ru film is formed under conditions such that the Ru film is somewhat overhung, i.e., that the step coverage is small. For example, film forming conditions of supply rate-determining are selected to form the cavity 17 in the PL electrode 16.

The subsequent steps are the same as those for producing the conventional stack-type DRAM, as in the case of the first embodiment. Further, the PL electrode 16 may be made of another conducive film and the capacitor insulating film 15 may be made of another conductive film as described before in the section of the first embodiment.

In the third embodiment, the same effect as in the first embodiment can be obtained. In particular, according to the third embodiment, even if it is difficult to form a cavity 17 by utilizing the shape of the SN electrode, e.g., the SN electrode 143 is box-shaped, the cavity 17 can be formed by adjusting film forming conditions suitably. Thus, the effect of the present invention can be obtained.

Further, the method of the third embodiment is applicable to a hollow (e.g., cylindrical hollow) SN electrode whose side wall is perpendicular to the surface of the substrate. In this case, a cavity 17 is formed in the PL electrode both inside of the hollow SN electrode and outside thereof in a region between the outer surfaces of the two adjacent hollow SN electrodes, with the result that the same effect as described above is obtained.

Fourth Embodiment

Figure 14A:
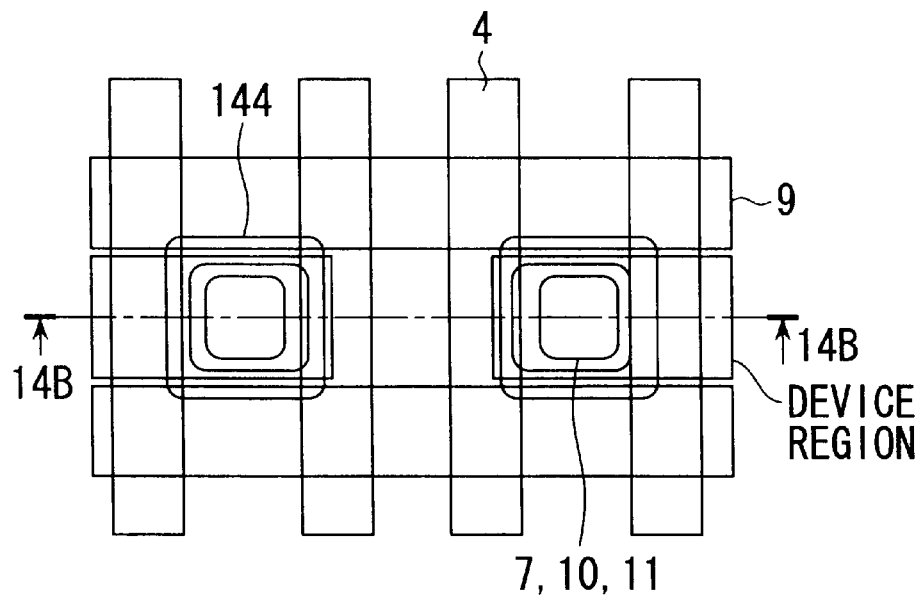
FIG. 14A is a plan view of a memory cell of a stack-type DRAM according to a fourth embodiment of the present invention.
Figure 14B:
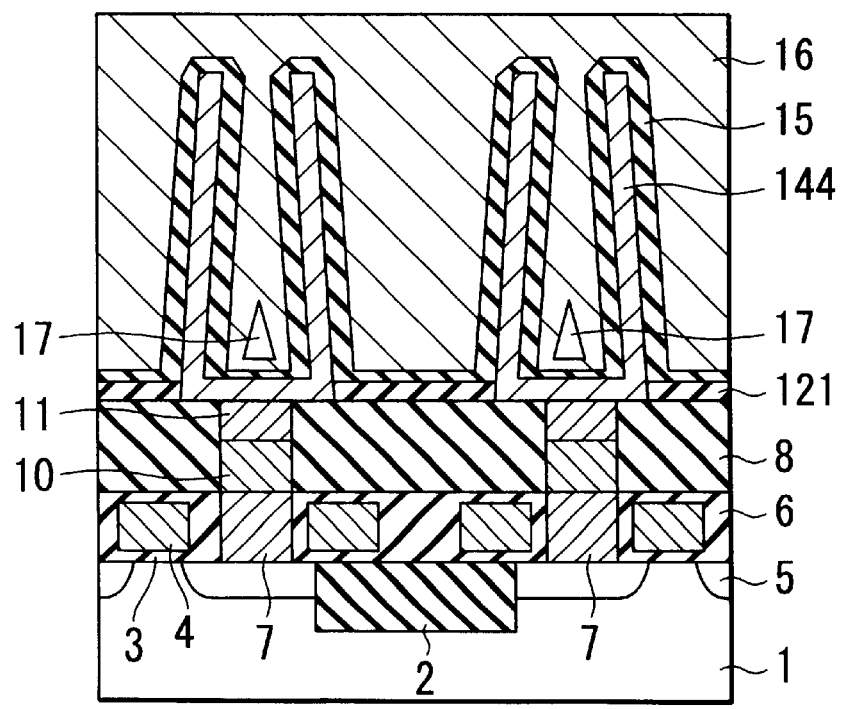
FIG. 14B is a cross-sectional view of the memory cell of the stack-type DRAM according to the fourth embodiment.

FIG. 14A is a plan view of a memory cell of a stack-type DRAM according to a fourth embodiment of the present invention. FIG. 14B is a cross-sectional view of the memory cell taken along the line 14B—14B in FIG. 14A.

The fourth embodiment is different from the second embodiment in the angle of the side wall of the SN electrode. More specifically, the side wall (in cross section) of the SN electrode 142 of the second embodiment is backward-tapered with respect to the surface of the substrate, whereas the side wall (in cross section) of an SN electrode 144 of the fourth embodiment is forward-tapered with respect to the surface of the substrate.

A method for producing a memory cell having the SN electrode 144 will now be described. Since the steps to obtain the structure shown in FIGS. 3A and 3B are the same as those of the first embodiment, the descriptions thereof will be omitted.

Figure 15A:
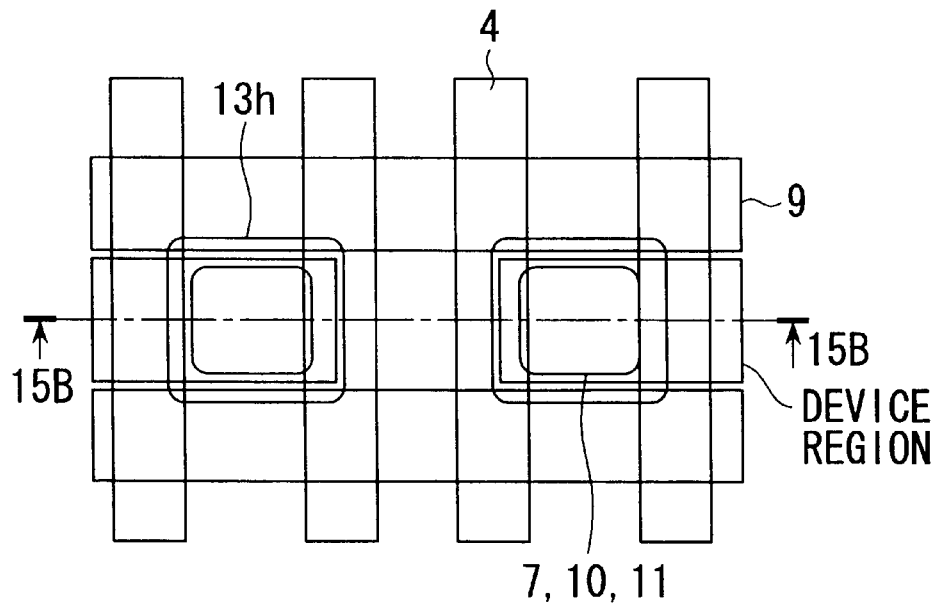
FIG. 15A is a plan view showing a first step for manufacturing the memory cell of the stack-type DRAM according to the fourth embodiment.
Figure 15B:
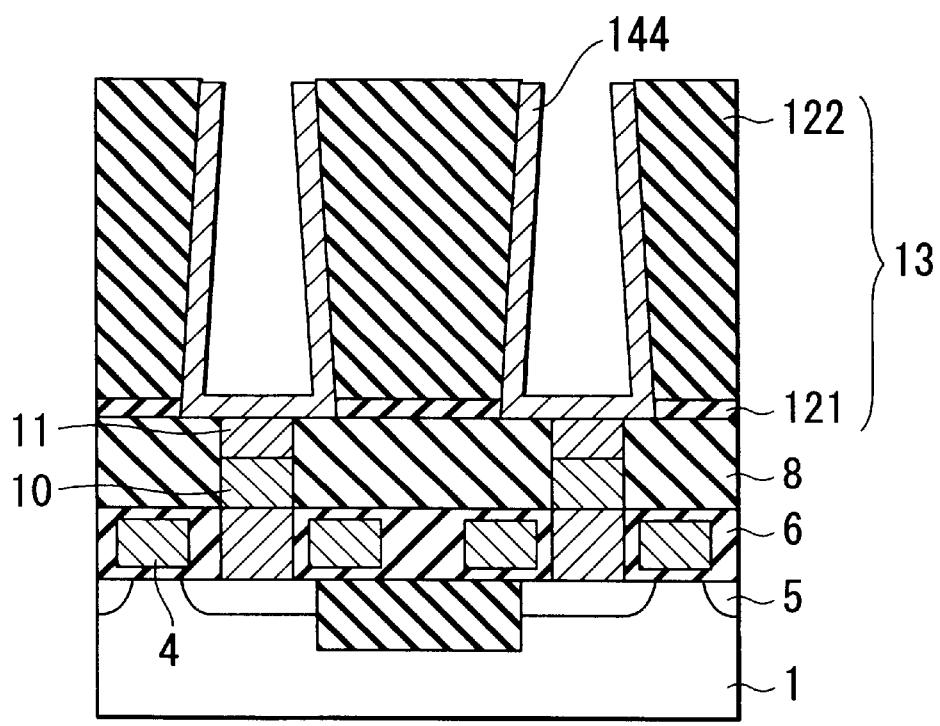
FIG. 15B is a cross-sectional view showing the first step for manufacturing the memory cell of the stack-type DRAM according to the fourth embodiment.

Subsequently to the step shown in FIG. 3B, an SN groove pattern 13 is formed, in which the side wall is backward-tapered with respect to the surface of the substrate, as shown in FIGS. 15A and 15B. Then, the surface of the barrier metal 11 on the bottom of the SN groove pattern 13 is exposed.

Thereafter, an Ru film of a thickness of, for example, about 30 nm, to serve as the SN electrode 144, is deposited on the above structure by CVD. Then, the unnecessary portion of the Ru film is removed by, for example, CMP or etching-back, to flatten the surface. As a result, the inner wall of the SN groove pattern 13 is coated with the SN electrode 144.

At this time, a protecting film, such as a resist (not shown), may be used to protect the surface of the Ru film on the inner wall of the SN electrode 144 from damage or contamination in the CMP process. The protecting film is removed after the CMP process is completed. In this embodiment, the Ru film is used as the SN electrode 144; however, any other metal film as described in the above section of the first embodiment may be used instead.

Figure 16A:
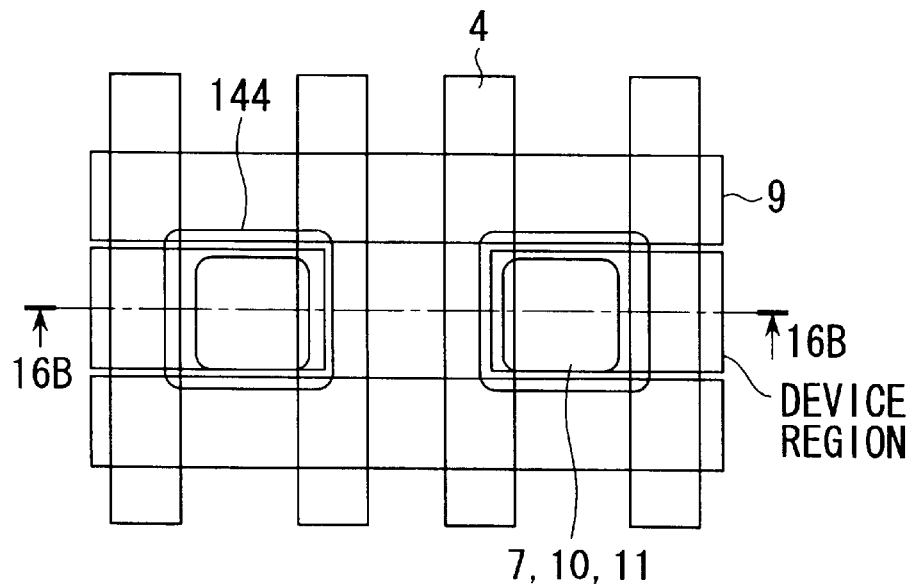
FIG. 16A is a plan view showing a second step for manufacturing the memory cell of the stack-type DRAM according to the fourth embodiment.
Figure 16B:
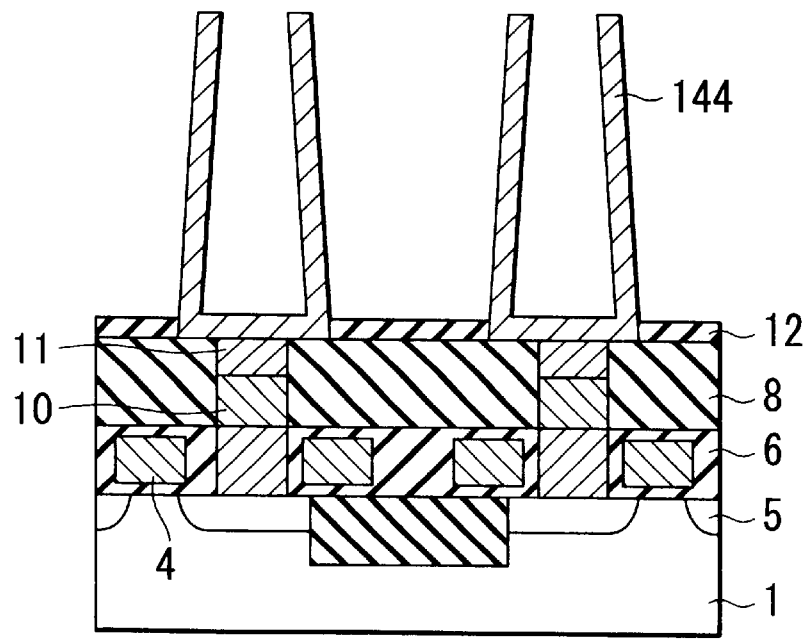
FIG. 16B is a cross-sectional view showing the second step for manufacturing the memory cell of the stack-type DRAM according to the fourth embodiment.

The region from which the plasma TEOS oxide film 122 should not be removed, for example, the peripheral circuit portion, is covered by a resist (not shown). Thereafter, the plasma TEOS oxide film 122 is selectively etched by means of wet etching with, for example, an $NH_4F$ solution, or by means of the combination of RIE and wet etching. As a result, the structure shown in FIGS. 16A and 16B is formed. The etching is stopped at the silicon nitride film 121 under the plasma TEOS oxide film 122. Thus, the top surface of the SN electrode 144 in the memory cell portion is aligned with the top surface of the plasma TEOS oxide film 122 in the other portion. In other words, there is substantially no difference in height between the memory cell portion and the other portion regardless of whether the SN electrode 144 is present or not. In the process of manufacturing a stack-type DRAM, it is important to minimize the difference in height of the elements.

Alternatively, the plasma TEOS oxide film 122 on the overall substrate (wafer) may be selectively removed. In this case, the memory cell portion and the peripheral circuit portion become different in height. However, no problem arises in this case for the reason as described before in the section of the first embodiment.

Thus, the SN electrode 144 having a hollow shape (for example, a cylindrical hollow shape) is formed, in which the side wall is forward-tapered with respect to the surface of the substrate. As in the case of the first embodiment, the side surface of the SN electrode 144 is smooth. Therefore, electric field concentration, which may occur owing to roughness of the side surface of the SN electrode 144, can be reduced.

Thereafter, as shown in FIG. 14B, a capacitor insulating film 15 made of, for example, BST, is deposited on the above structure to a thickness of about 20 nm by CVD. Then, for example, an Ru film to serve as a PL electrode 16 is deposited on the capacitor insulating film 15 to a thickness of about 40 nm by, for example, CVD.

At this time, the Ru film is deposited such that a cavity 17 is formed within the PL electrode 16 inside the hollow SN electrode 144. In this embodiment, the SN electrode 144 having the side wall forward-tapered with respect to the surface of the substrate is formed, to form the cavity 17 in the PL electrode 16. The Ru film (PL electrode 16) may be deposited such that the cavity 17 is also formed at the same time in a portion of the PL electrode 16 between the two adjacent SN electrodes 144. In this case, the cavity 17 is formed by controlling the film forming conditions as in the third embodiment.

The subsequent steps are the same as those for producing the conventional stack-type DRAM, as in the case of the first embodiment. Further, the PL electrode 16 may be made of another conducive film and the capacitor insulating film 15 may be made of another conductive film as described before in the section of the first embodiment.

In the fourth embodiment, the same effect as in the first embodiment can be obtained. In particular, according to the fourth embodiment, the heat stress on the thin side wall of the SN electrode 144, having a hollow shape (for example, a hollow cylindrical shape), can be effectively reduced by the cavity 17 in the PL electrode 16. As a result, peeling of the cylindrical SN electrode 144 is prevented, which was difficult in the conventional art. Therefore, the manufacturing yield of the capacitor can be improved.

The present invention is not limited to the above embodiments. For example, although the above embodiments relate to a stack-type capacitor, the present invention can be applied to a concave-type capacitor. In the case of the concave-type capacitor, a cavity is present in a portion of an SN electrode sandwiched between PL electrodes of two adjacent capacitors. Such an SN electrode can be formed on a semiconductor substrate having a trench by depositing a conductive film, to serve as an SN electrode, under film forming conditions so that the step coverage is reduced.

Further, the semiconductor substrate may be formed of an SOI substrate instead of the normal silicon substrate, in order to reduce the parasitic capacitance and increase the process speed of the device. Alternatively, a semiconductor substrate having an active region made of SiGe may be used.

The present invention may be further modified within the scope of the gist of the invention.

As has been described above, according to the present invention, in a plurality of capacitors constituted by a plurality of electrodes and a common electrode connected with a capacitor insulating film interposed between therebetween, a cavity is formed in the common electrode. As result, a semiconductor device having a plurality of capacitors, which are not easily influenced by heat stress, can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate; and
a plurality of capacitors formed on the semiconductor substrate and having a plurality of first electrodes, a capacitor insulating film and a second electrode, the capacitor insulating film being interposed between the plurality of first electrodes and the second electrode, wherein a cavity is present in the second electrode.

2. A semiconductor device according to claim 1, wherein the plurality of capacitors are stack-type capacitors, the cavity is present in the second electrode, and the second electrode is a plate electrode of the stack-type capacitor.

3. A semiconductor device according to claim 1, wherein the cavity is present in a portion of the second electrode between adjacent two of the plurality of first electrodes.

4. A semiconductor device according to claim 1, wherein each of the plurality of first electrodes has a solid rectangular cross section having sides backward-tapered with respect to a surface of the semiconductor substrate.

5. A semiconductor device according to claim 1, wherein each of the plurality of first electrodes has a cylinder-type cross section having sides backward-tapered with respect to a surface of the semiconductor substrate.

6. A semiconductor device according to claim 1, wherein each of the plurality of first electrodes has a solid rectangular cross section having sides substantially perpendicular to a surface of the semiconductor substrate.

7. A semiconductor device according to claim 1, wherein each of the plurality of first electrodes has a cylinder-type cross section having sides substantially perpendicular a surface of the semiconductor substrate.

8. A semiconductor device according to claim 1, wherein each of the plurality of first electrodes has a cylinder-type cross section having sides forward-tapered with respect to a surface of the semiconductor substrate, and the cavity is present in a portion of the second electrode inside the first electrodes.

9. A semiconductor device according to claim 1, wherein each of the plurality of first electrodes has a cylinder-type shape in cross section, cavities are present in portions of the second electrode that are inside the cylinder-type shapes of the first electrodes, and portions of the second electrode that are sandwiched between two adjacent first electrodes.

10. A semiconductor device according to claim 1, wherein the second electrode is made of a conductive film containing one of Ru, W and Ti.

11. A semiconductor device according to claim 1, wherein the capacitor insulating film is made of one of an oxide film containing Ta and an oxide film containing Sr and Ti.

12. A semiconductor device according to claim 1, wherein the plurality of capacitors are concave-type capacitors, and the plurality of first electrodes are storage node electrodes of the concave-type capacitors.

13. A semiconductor device comprising:
a semiconductor substrate;
a plurality of storage node electrodes formed on the semiconductor substrate;
a capacitor insulating film formed on the plurality of storage node electrodes; and
a plate electrode formed on the capacitor insulating film and opposing to the plurality of storage node electrodes on the capacitor insulating film, and at least one cavity formed in the plate electrode.

14. A semiconductor device according to claim 13, wherein the cavity is present in a portion of the plate electrode between adjacent two of the plurality of storage node electrodes.

15. A semiconductor device according to claim 13, wherein each of the plurality of storage node electrodes has a solid rectangular cross section having sides backward-tapered with respect to a surface of the semiconductor substrate.

16. A semiconductor device according to claim 13, wherein each of the plurality of storage node electrodes has a cylinder-type cross section having sides backward-tapered with respect to a surface of the semiconductor substrate.

17. A semiconductor device according to claim 13, wherein each of the plurality of storage node electrodes has a solid rectangular cross section having sides substantially perpendicular to a surface of the semiconductor substrate.

18. A semiconductor device according to claim 13, wherein each of the plurality of storage node electrodes has a cylinder-type cross section having sides substantially perpendicular a surface of the semiconductor substrate.

19. A semiconductor device according to claim 13, wherein each of the plurality of storage node electrodes has a cylinder-type cross section having sides forward-tapered with respect to a surface of the semiconductor substrate, and the cavity is present in a portion of the plate electrode inside the storage node electrodes.

20. A semiconductor device according to claim 13, wherein each of the plurality of storage node electrodes has a cylinder-type shape in cross section, cavities are present in portions of the plate electrode that are inside the cylinder-type shapes of the storage node electrodes, and portions of the plate electrode that are sandwiched between two adjacent storage node electrodes.

21. A semiconductor device according to claim 13, wherein the plurality of storage node electrodes, the capacitor insulating film and-the plate electrode constitute a stack-type capacitor.

22. A semiconductor device comprising:

a semiconductor substrate;

a plurality of storage node electrodes formed on the semiconductor substrate and spaced apart from one another;

a capacitor insulating film formed on upper surfaces and side surfaces of the plurality of storage node electrodes; and a plate electrode formed on the upper surfaces of the plurality of storage node electrodes and between adjacent storage node electrodes, a cavity being within the plate electrode, the capacitor insulating film being interposed between the plurality of storage node electrodes and the plate electrode.

23. A semiconductor device comprising:

a semiconductor substrate; and a capacitor formed on the semiconductor substrate and having a first electrode, a capacitor insulating film and a second electrode, the capacitor insulating film being interposed between the first electrode and the second electrode, wherein a cavity is present in the second electrode.

\* \* \* \* \*

UNITED STATES PATENT AND TRADEMARK OFFICE
CERTIFICATE OF CORRECTION

PATENT NO. : 6,611,017 B2
DATED : August 26, 2003
INVENTOR(S) : Hieda

It is certified that error appears in the above-identified patent and that said Letters Patent is hereby corrected as shown below:

Column 16,
Line 21, change "perpendicular a" to -- perpendicular to a --.

Column 17,
Line 25, change "and-the" to -- and the --.

Column 18,
Lines 17-25, delete the claim in its entirety.

Signed and Sealed this

Ninth Day of March, 2004

JON W. DUDAS
*Acting Director of the United States Patent and Trademark Office*